United States Patent
Wang et al.

(10) Patent No.: US 10,455,704 B2
(45) Date of Patent: Oct. 22, 2019

(54) METHOD FOR COPPER FILLING OF A HOLE IN A COMPONENT CARRIER

(71) Applicant: AT&S Austria Technologie & Systemtechnik Aktiengesellschaft, Leoben (AT)

(72) Inventors: Ares Wang, Shanghai (CN); Yee-Bing Ling, Kuching (MY); Annie Tay, Singapore (SG)

(73) Assignee: AT&S AUSTRIA TECHNOLOGIE & SYSTEMTECHNIK AKTIENGESELLSCHAFT, Leoben (AT)

( * ) Notice: Subject to any disclaimer, the term of this patent is extended or adjusted under 35 U.S.C. 154(b) by 0 days.

(21) Appl. No.: 16/049,512

(22) Filed: Jul. 30, 2018

(65) Prior Publication Data
US 2019/0037703 A1    Jan. 31, 2019

(30) Foreign Application Priority Data
Jul. 31, 2017  (CN) .......................... 2017 1 0642142

(51) Int. Cl.
*H01K 3/10*  (2006.01)
*H05K 3/00*  (2006.01)
(Continued)

(52) U.S. Cl.
CPC ......... *H05K 3/0094* (2013.01); *H05K 1/0298* (2013.01); *H05K 3/0026* (2013.01);
(Continued)

(58) Field of Classification Search
CPC .... H05K 3/0094; H05K 3/4644; H05K 3/244; H05K 3/241; H05K 3/0055;
(Continued)

(56) References Cited

U.S. PATENT DOCUMENTS 6,555,762 B2    4/2003   Appelt et al.
8,617,987 B2 *  12/2013  Gan .................... H01L 25/105
                                                     438/109
(Continued)

FOREIGN PATENT DOCUMENTS

EP    1 330 146 A2   7/2003
EP    2 778 260 A2   9/2014
(Continued)

OTHER PUBLICATIONS

European Patent Office, Extended European Search Report, dated Dec. 17, 2018, pp. 1-9, Munich, Germany.

*Primary Examiner* — Donghai D Nguyen
(74) *Attorney, Agent, or Firm* — Robert A. Blaha; Smith Tempel Blaha LLC

(57) ABSTRACT

A method of filling a hole formed in a component carrier with copper is disclosed. The method comprises i) forming a layer of an electrically conductive material covering at least part of a surface of a wall, wherein the wall delimits the hole, and subsequently ii) covering at least partially the layer and filling at least partially an unfilled volume of the hole with copper using a plating process including a bath. Hereby, the bath comprises a concentration of a copper ion, in particular $Cu^{2+}$, in a range between 50 g/L and 75 g/L, in particular in a range between 60 g/L and 70 g/L.

15 Claims, 6 Drawing Sheets

(51) Int. Cl.
*H05K 1/02* (2006.01)
*H05K 3/24* (2006.01)
*H05K 3/46* (2006.01)
*H05K 3/42* (2006.01)

(52) U.S. Cl.
CPC ........... *H05K 3/0055* (2013.01); *H05K 3/241* (2013.01); *H05K 3/244* (2013.01); *H05K 3/423* (2013.01); *H05K 3/4644* (2013.01); H05K 2201/0344 (2013.01); H05K 2201/09563 (2013.01); H05K 2203/1476 (2013.01); *Y10T 29/49165* (2015.01)

(58) Field of Classification Search
CPC .. H05K 3/0026; H05K 1/0298; H01L 25/105; C25D 3/38; Y10T 29/49155; Y10T 29/49165
USPC .................................................... 29/846, 852
See application file for complete search history.

(56) References Cited

U.S. PATENT DOCUMENTS

2004/0231995 A1* 11/2004 Murao .................... C25D 3/38
 205/125
2011/0284386 A1 11/2011 Willey et al.
2015/0289387 A1 10/2015 Mirkovic et al.

FOREIGN PATENT DOCUMENTS

EP 2 778 261 A1 9/2014
WO WO 2008/153185 A1 12/2008

\* cited by examiner

METHOD FOR COPPER FILLING OF A HOLE IN A COMPONENT CARRIER

TECHNICAL FIELD

The invention relates to the filling of a hole in a component carrier, to an arrangement, and to a component carrier.

BACKGROUND

Electronic assemblies and circuits comprising electronic components are typically built up on component carriers such as printed circuit boards (PCBs). A manufacturing process of a so-called multilayer component carrier typically includes filling holes in the component carrier with electrically conductive material such as copper.

Density and complexity of electronic components are constantly increasing and holes in component carriers, such as laser drilled holes, are getting smaller, while the aspect ratios of the holes are getting higher. In this respect it is a common problem that failures in the material which is used for filling these holes are produced during the component carrier manufacturing process. Failures such as cracks or voids in the filling material of the holes are often not avoidable when manufacturing component carriers. These cracks and voids lead to severe problems concerning the functionality of the electronic assembly built upon the component carrier. Consequently, the quality of signal transmission, especially in the case of high frequencies, will be significantly reduced.

The problem of crack and void formation may be inherent to the manufacturing process step of filling a hole in a component carrier as will be apparent from the following descriptions.

In general, an electro-plating process is applied in order to fill a hole in a component carrier. Therefore, an anode (positively charged) is placed into a bath in order to establish an electric field between the anode and a negatively charged entity, which should be electro-plated, and which serves as a cathode. The electric field drives cations, such as copper ions, which are dissolved in the bath, to the surface of the entity, which should be electro-plated. At the negatively charged surface, the cations will be chemically reduced and a layer of copper will start growing on the surface of the entity, which should be electro-plated. This process can be used for filling the hole. In the following, two prior art examples are described and it will be apparent from these prior art examples, how the failures within the filling material emerge.

A prior art example of a conventional process for filling a hole in a component carrier by electro-plating is illustrated in FIG. 3A and FIG. 3B. FIG. 3A shows a hole 320 in a component carrier 300, wherein the hole 320 is physically delimited by walls 330a and 330b, and a bottom structure 333. Hereby, the bottom structure 333 and the surfaces of the walls 330a and 330b should be electro-plated to thereby fill the hole 320 with copper. It can be clearly seen in FIG. 3A that copper material 310 starts growing from the left wall 330a, the right wall 330b, and from the bottom structure 333. However, it can also be clearly seen that the growing of the copper material 310 takes place in an irregular manner. In the center of each copper material portion 310, at the walls 330a and 330b, and at the bottom structure 333, the growing speed is faster, and consequently the thickness of the copper material 310 is higher, than for the copper material 310 at the outsides of the walls 330a and 330b, and the bottom structure 333. Growing directions are hereby indicated by arrows. As a result, gaps 345 remain at the transition regions between the walls 330a and 330b, and the bottom structure 333 of the hole 320.

When the growing process is finished and the hole is filled with copper 310', failures 350 such as cracks and/or voids will remain in the center of the filled hole 320', as can be seen in FIG. 3B. These failures 350 directly result from the irregular growing process of the copper material 310', because the gaps 345 remain during the growing process and finally result in cracks and/or voids, which cannot be repaired anymore.

Conventionally, such failures and the accompanied problems are accepted as unavoidable. Some manufacturers apply chemical additives in order to support a regular growth of the copper material in order to fill the hole without gap formation and a subsequent failure formation. However, these chemical additives often do not reach the locations of the gaps in a sufficient amount. Rather, the chemical additives are brought into the hole (chemical source) and out of the hole again (chemical drain) without providing a large influence to the copper material growth and the gap locations.

A prior art example of such a conventional process of filling a hole in a component carrier by using chemical additives is illustrated in FIGS. 4A and 4B. FIG. 4A shows a component carrier 400 similar to the component carrier shown in FIG. 3. Indicated by arrows is a source direction 450 of chemical additives and a drain direction 451 of chemical additives. It can be seen that the chemical additives are introduced near the hole 320 in a first direction 450 and that the chemical additives drain from the hole 320 in a second direction 451. However, the flow of chemical additives does not efficiently reach the gaps 345 between the copper material portions 310. Therefore, there are still failures such as cracks and/or voids in the filled copper material 310' in the final component carrier 400, as can be seen in FIG. 4B.

Furthermore, a prior art example of a conventional hole 520 in a conventional component carrier 500 is illustrated in FIG. 5. The thickness of the layer of electrically conductive material 310 at the bottom 333 is 4.18 μm, while the thickness of the layer of electrically conductive material 310 at the left wall 330a is 4.27 μm and the thickness of the layer of electrically conductive material 310 at the right wall 330b is 4.84 μm. Hereby, the hole 520 is 63.68 μm in height and the largest diameter of the hole 520 is 83.36 μm. Above the shoulders 332 to the left and right side of the top of the hole 520, the thickness of the layer of electrically conductive material 310 is 4.18 μm. Furthermore, it can be seen that the layer of electrically conductive material 310 on the surface of the walls 330a, 330b is not smooth at all. In summary, the thickness of the layer of electrically conductive material 310 at the walls 330a, 330b, and at the bottom 333 is very thin and irregularly shaped. As a consequence, the filling of the hole 520 with electrically conductive material is hampered and cannot be performed in an efficient manner.

Because processes using chemical additives often do not work efficiently, the performance is generally poor and failures remain. Furthermore, chemical additives lead to additional costs and are generally environmentally harmful and therefore no efficient process for failure-free filling of a hole in a component carrier is provided so far.

SUMMARY

There may be a need to increase the efficiency for filling a hole formed in a component carrier with copper, while failures in the filled copper material are avoided.

A method for filling a hole formed in a component carrier with copper, an arrangement for carrying out the method, and a component carrier, which has been manufactured with the described method, according to the independent claims are provided.

According to an exemplary embodiment of the invention, a method of filling a hole formed in a component carrier with copper is provided. The method comprises the steps of i) forming a layer of an electrically conductive material covering at least part of a surface of a wall, wherein the wall delimits the hole, and subsequently ii) covering at least partially the layer and filling at least partially an unfilled volume of the hole with copper using a plating process including a bath. Hereby, the bath comprises a concentration of a copper ion, in particular $Cu^{2+}$, in a range between 50 g/L and 75 g/L, in particular in a range between 60 g/L and 70 g/L.

According to an exemplary embodiment, the described method may be based on the idea that a hole in a component carrier may be very efficiently filled with copper, when performing the presented method, wherein two steps are used for the filling process. In the first step, there may be a very thin layer of electrically conductive material formed at least partially on the surfaces of walls, which physically delimit the hole. In a second step, the layer of electrically conductive material may be used as a conductive surface for initiating a plating process. The plating process may be performed in order to cover the conductive surface and fill at least partially the hole with copper. Hereby, the plating process includes the use of a bath. The component carrier may be placed at least partially into the bath in order to perform the plating process and to fill the hole with copper. The bath may comprise a copper ion, in particular $Cu^{2+}$, for filling the hole in the component carrier with copper during the plating process. Hereby, the copper concentration in the bath is enormously increased to an amount in a range between 50 g/L and 75 g/L, in particular 60 g/L and 70 g/L. Such an unusually high copper concentration may be very different to the expectations of a skilled person and may distinguish the method from the prior art. In this manner, an unexpected improvement of the quality of the copper material within the filled hole is efficiently achieved by the described method and failures such as cracks and/or voids in the copper material may be avoided.

According to an exemplary embodiment, the described method may allow for efficiently using copper in a plating process for filling a hole formed in a component carrier without the necessity of chemical additives. Thus, the method described in this document may also be cost-efficient and environmentally friendly in comparison to prior art methods, which need supplementary chemical additives. Furthermore, the quality and functionality of the resulting component carrier may be highly improved, in particular in the technical field of signal transmission, in comparison to prior art component carriers.

According to a further exemplary embodiment of the invention, a component carrier is provided, which has been manufactured with the method described above. The component carrier comprises a stack of at least one electrically insulating layer structure and at least one electrically conductive layer structure.

The described component carrier may be a high quality component carrier, wherein copper material, which has been filled into holes, does not comprise failures such as cracks and/or voids. Stated differently, a filled hole or a partially filled hole is devoid of failures such as cracks or voids.

According to another exemplary embodiment of the invention, a plater arrangement for filling a hole in a component carrier with copper is provided. In particular, the plater arrangement is configured for carrying out the above described method of filling a hole formed in a component carrier with copper. The plater arrangement comprises an electro-less plater section for forming a layer of an electrically conductive material, which layer covers at least part of a surface of a wall of a component carrier, wherein the wall delimits the hole in the component carrier. Furthermore, the plater arrangement comprises an electro-plater section for covering at least partially the layer and filling at least partially an unfilled volume of the hole with copper by an electro-plating process. The electro-plater section further comprises a bath for plating with copper, wherein the bath comprises a concentration of a copper ion, in particular $Cu^{2+}$, in a range between 50 g/L and 75 g/L, in particular in a range between 60 g/L and 70 g/L.

The described plater arrangement may be configured to manufacture the component carrier described above. The described plater arrangement may furthermore yield the same advantages as the method and the component carrier described above.

OVERVIEW OF EMBODIMENTS

In the context of the present application, the term "component carrier" may particularly denote any support structure which is capable of accommodating one or more electronic components thereon and/or therein for providing both mechanical support and electrical connectivity.

In the context of the present application, the term "hole formed in a component carrier" may particularly denote a region in the component carrier without solid or liquid material. This region may be filled with a gaseous fluid such as air. In a vacuum environment, the region may be completely empty. Furthermore, the term "hole" may denote a vertical structure within the component carrier.

Formation of the hole may be accomplished by laser drilling, by mechanical drilling, by lithography, by etching technology or by a combination thereof. The hole may be a through hole or a blind hole. When the hole is a through hole, it extends from the surface of a layer of the component carrier through the layer of the component carrier to an underside of the layer of the component carrier. In this case, there may be no material below the hole. A through hole may be shaped as a cone or as a tube. When the hole is a blind hole, it may extend from the surface of a layer of the component carrier through the layer of the component carrier but not to an underside of the layer of the component carrier. In this case, there may be a bottom layer or surface at the lowest point of the hole provided within the component carrier. A blind hole may be shaped as a cone or as a tube.

The sidewalls of the hole may exhibit an angle θ with respect to a bottom plane of the hole and an angle with respect to a top plane of the hole. These angles may be precisely defined and the angle with respect to the bottom plane of the hole and the angle with respect to the top plane of the hole may be equal throughout the entire circumference of the hole, respectively.

A through hole or a blind hole may also be configured as a vertical interconnection access (via).

In the context of the present application, the term "plating process" may particularly denote a process of plating, i.e. covering of a conductive surface, in which process a metal is deposited onto the conductive surface. This may be done in an electro-plating manner or in an electro-less plating manner as will be described below in more detail.

In the context of the present application, the term "bath" may particularly denote a solution used for a plating process. In its most basic form, the bath contains an electrolyte used for plating a surface of an entity. The electrolyte may be a cation, in particular a metallic cation. The electrolyte may comprise copper ions, in particular $Cu^{2+}$. The surface of the entity, which should be plated, may be placed, at least temporarily, into the bath in order to perform the plating process. In this manner, different kinds of plating processes may be performed by using the bath. The bath may have a temperature in a range between 30° and 50° Celsius, in particular 35° to 45° Celsius.

In the following, embodiments of the method, the arrangement, and the component carrier will be explained.

According to an embodiment the bath is supplied with copper sulfate, $CuSO_4$, and/or copper sulfate pentahydrate, $CuSO_4*5H_2O$. This may provide the advantage that the bath with its advantageous effects can be realized by employing well known and approved process technologies.

Copper may be added to the bath in the physical form of its anhydrous salt copper sulfate. Furthermore, copper may be added to the bath in the physical form of the hydrous salt copper sulfate pentahydrate. For example, an amount of 1000 kg of copper sulfate, or an amount of 1400 kg copper sulfate pentahydrate, may be added to a bath with a volume of 5500 L in order to achieve a copper ion concentration in a range between 50 g/L and 75 g/L. When added to the bath, copper sulfate and/or copper sulfate pentahydrate may dissolve into a copper ion $Cu^{2+}$ and a sulfate ion $SO_4^{2-}$.

According to a further embodiment the bath further comprises sulfuric acid, $H_2SO_4$, with a concentration in the range between 80 g/L and 110 g/L, in particular in a range between 90 g/L and 100 g/L. This may provide the advantage that sulfuric acid may be applied in order to control chemical and physical parameters of the bath including conductibility, solubility of the electrolytes, concentration of the copper ions, and copper deposition rate.

Sulfuric acid may e.g. be used to control the amount of copper ions in solution. A high concentration of sulfuric acids may lead to a low concentration of copper ions in the bath and vice versa. When sulfuric acid is brought into water, the water molecules will be protonated to $H_3O^+$. This may hamper the formation of copper ions. If the concentration of sulfuric acid is decreased, less water molecules may be protonated and the concentration of copper ions may increase.

Due to its chemical properties, sulfuric acid may influence the conductibility within the bath, the solubility of the electrolytes, and the copper deposition rate. It may further be used to adjust the pH of the bath. Sulfuric acid may be diluted, for example to 50%, by addition of water.

According to a further embodiment the bath further comprises at least one of the group consisting of iron ions, in particular $Fe^{2+}$ and $Fe^{3+}$, chloride, $Cl^-$, a brightening agent, and a leveler agent. This may allow for a large variety of chemical and physical parameters of the bath and of the plating process to be adjusted in a fast and reliable manner.

According to a further embodiment the method further comprises filling at least partially a remaining volume of the hole with copper using a further plating process including a further bath, wherein the further bath comprises at least approximately the same composition of chemical ingredients and/or at least approximately the same concentration of chemical ingredients as the first bath. This may provide the advantage that the quality of the copper material, which has been filled into the hole, may be further improved.

It may happen that not the entire volume of a hole in a component carrier can be or is filled by a plating process in a first bath. Therefore, it may be suitable to arrange a second bath behind the first bath. In other words, the second bath may be arranged downstream of the first bath, when viewing in a process direction of a component carrier manufacturing process. The second bath may comprise the same chemical and/or physical properties as the first bath in order to fill a remaining volume of the hole in exactly the same manner as done by the first bath.

According to a further embodiment the method further comprises filling at least partially a remaining volume of the hole with copper using a further plating process including a further bath, wherein the further bath comprises a different composition of chemical ingredients and/or a different concentration of chemical ingredients as the first bath. This may provide the advantage that the flexibility of the method is highly improved.

Instead of filling a remaining volume of the hole in exactly the same manner as the first bath, the second bath may comprise a different composition as the first bath in order to adjust the process of filling the hole in the component carrier in a suitable manner, depending on the present situation.

According to a further embodiment the formed layer of electrically conductive material comprises a thickness in the range between 0.1 μm and 1 μm, in particular in the range between 0.3 μm and 0.7 μm. This may provide the advantage that only a small amount of electrically conductive material is needed and therefore material cost may be saved.

Such an unusually thin layer of electrically conductive material may be surprisingly thick enough to ensure that a high quality electrically conductive material layer is existent, which is needed for initiating a subsequent electro-plating process.

According to a further embodiment the copper material, which has been formed above the electrically conductive material, in particular by flash-plating, comprises a thickness in the range between 0.3 μm and 15 μm, in particular in the range between 4 μm and 10 μm.

According to a further embodiment forming the layer of electrically conductive material is done by electro-less plating. This may provide that advantage that the method with its advantageous effects can be realized by employing well known and approved process technologies.

Electro-less plating may also be termed chemical or auto-catalytic plating and is a non-galvanic method that may involve several simultaneous reactions in a bath. For example, in a first place an electro-less plating step is performed in order to produce a conductive layer upon an electrically insulating layer of a component carrier. This electrically conductive layer is necessary for performing a subsequent electro-plating step. This is because during an electro-plating process in a bath, the entity, which should be electro-plated, is used as a cathode (negatively charged). The negative charge can be set e.g. by means of a power supply, which contacts the surface of the entity, which should be electro-plated, e.g. with contact rings. However, this can only be done, if the surface of the entity is made of electrically conductive material. Therefore, electro-less plating may be mandatory in order to produce a thin electrically conductive material layer onto an electrically insulating material in a first step.

According to the term electro-less, electro-less plating is done without the use of external electrical power. However, the solution for the electro-less plating process may need to comprise a reducing agent. In principle, any hydrogen-based reducing agent may be used. In the case of electro-less nickel plating, typically hypophosphite may be used. In the case of electro-less copper plating, typically a low molecular weight aldehyde such as formaldehyde is used. Furthermore, the surface, which should be plated, needs a catalytic surface. In general, such a catalytic surface may be produced by depositing small amounts of a catalytic agent, e.g. palladium, onto the surface, which should be plated. For example, metallic ions, such as copper ions, may be reduced to copper, when in contact with the catalytic surface. This is because reducing agents, such as formaldehyde, may be oxidized, when in contact with the catalytic surface. Electrons may be transferred from the reducing agent to the copper ions in this manner.

According to a further embodiment at least partially covering the layer and at least partially filling the hole is done by electro-plating, in particular flash-plating. This may also provide that advantage that the method with its advantageous effects can be realized by employing well known and approved process technologies.

The term electro-plating, also termed galvanizing, may refer to a process of deposition metallic ions onto a surface, which should be plated. Electro-plating may take place in a bath and may comprise the use of an anode and a cathode.

An anode is an electrode through which current may flow into a polarized electrical device. The anode is charged positively, while the product that may be electro-plated is negatively charged, thereby forming a cathode. This may be controlled by a power supply connected to the anode and the product that should be electroplated. In this manner, the component carrier may be charged negatively by means of the power supply. For example, the surface of the component carrier may be connected to the power supply by means of a contact ring.

The anode may be an inert anode and therefore no material from the anode is dissolved into a fluid volume. Instead, an electrolyte may be injected by means of an electrolyte reservoir, which controls the amount of dissolved electrolyte in the fluid volume. The electrolyte may for example comprise copper ions ($Cu^{2+}$), aluminum ions ($Al^{3+}$) or nickel ions ($Ni^{2+}$).

The term flash-plating may refer to a very fast and highly efficient electro-plating process. For example the concentration of the electrolyte, e.g. copper, may be suddenly increased to very high concentrations in order to provide a very fast electro-plating process. The hole in the component carrier may be filled partially by flash-plating and then the rest of the hole may be filled by applying known via fill techniques. However, the hole may as well be completely filled by flash-plating.

According to a further embodiment the method further comprises i) drilling the hole with a laser, and ii) removing waste products, in particular black oxides, caused by laser drilling. This may provide the advantage that a high quality hole is produced with precise physical dimensions and without any disturbing physical structures.

There are a variety of laser techniques available for drilling a hole in a component carrier. For example $CO_2$ laser, Excimer laser, Nd-YAG laser, or UV laser. During the laser drilling, heat is produced and may trigger chemical reactions. Such reactions may include the formation of oxides, in particular so-called black oxides. These include, but are not limited to oxides of iron (e.g. magnetite, $Fe_3O_4$) and manganese (e.g. permanganate, $MnO_4$). A black oxide may also refer to a conversion coating for ferrous materials, stainless steel, copper and copper based alloys, zinc, powdered metals, and silver solder.

According to a further embodiment the method further comprises drilling the hole with a laser. Thereby, forming of the layer is performed without previously removing waste products, in particular black oxides, caused by laser drilling. This may provide the advantage that the method can be accomplished in a fast and effective manner. In particular, this embodiment of the invention may be suitable if the remaining waste products do not have or do only have a small negative impact on the resulting component carrier.

According to a further embodiment the aspect ratio of the hole is in the range between 0.5 and 1.5, in particular in a range between 0.8 and 1.0, further. In particular the aspect ratio is approximately 0.9. This may provide the advantage that high-quality holes, which are generally very small, may be suitable for the method.

The aspect ratio of a geometric shape may be the ratio of its sizes in different dimensions. For example, the aspect ratio of a rectangle is the ratio of its longer side to its shorter side. In the case of a tube-shaped hole, the aspect ratio may also be the ratio of its longer side to its shorter side.

According to a further embodiment the hole is configured as a through hole or as a blind hole. This may provide the advantage that the method is very flexible and may be implemented into a large variety of processes.

For example, a filled blind hole may be used as a via in order to electrically interconnect different electrically conductive layers within a component carrier. Furthermore, a filled through-hole may be used as a via in order to electrically interconnect different electrically conductive layers of different stacks of component carriers.

According to a further embodiment, the electrically conductive material comprises at least one of a group consisting of copper, aluminum, and nickel. This may provide the advantage that the method with its advantageous effects can be realized by employing well known and approved process technologies.

According to a further embodiment, the filled hole of the component carrier is failure-free, in particular crack-free and void-free. This may provide the advantage that a high quality component carrier may be provided with an efficient functionality e.g. in the technical filed of signal transduction or transmission. Furthermore, the high quality component carrier may have been manufactured in a cost-efficient and environmentally friendly manner, because no supplementary chemical additives are needed.

According to a further embodiment, the component carrier may be a laminate formed out of the mentioned electrically insulating layer structure(s) and electrically conductive layer structure(s), in particular formed by applying mechanical pressure, if desired supported by thermal energy. The mentioned stack may result in a plate-shaped component carrier capable of providing a large mounting surface for further electronic components and being nevertheless very thin and compact.

The term "layer structure" may particularly denote a continuous layer, a patterned or spatially structured layer or a plurality of non-consecutive islands within a common layer. Thus, the component carrier described in this document may also comprise a multilayer structure of electrically insulating structures and a multilayer structure of electrically conductive layers, wherein the number of layers is not limited.

According to a further embodiment, the at least one electrically insulating layer structure and/or the at least one further electrically insulating structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well. This may provide the advantage that the described component carrier with its advantageous effects can be realized by employing well known and approved process technologies.

According to a further embodiment, the component carrier is shaped as a plate. This may provide the advantage that the component carrier may be realized with a compact design, wherein the component carrier nevertheless may provide a spatially large basis for mounting a plurality of electronic components thereon.

According to a further embodiment, the component carrier is a multilayer component carrier. Specifically, the component carrier is a compound of several layer structures which are stacked onto each other and may be connected together by applying a pressing force, if desired accompanied by heat. At least some layers of the multilayer structure may be or may be realized a so called prepreg layer.

According to a further embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

BRIEF DESCRIPTION OF THE DRAWINGS

Embodiments of the component carrier can be better understood with reference to the following drawings. The elements and features in the drawings are not necessarily to scale, emphasis instead being placed upon clearly illustrating the structures and principles of operation of the assemblies.

DETAILED DESCRIPTION OF ILLUSTRATED EMBODIMENTS

Figure 1A:
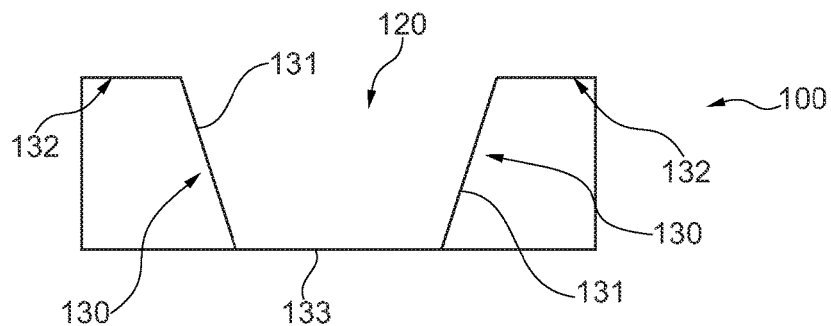
FIG. 1A, FIG. 1B, FIG. 1C and FIG. 1D illustrate a method for failure-free filling of a hole in a component carrier with copper according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to exemplary embodiments of the invention the filling capability of holes in a component carrier is improved and better reliability of the component carrier, in particular a PCB, regarding functionality is achieved. Usually, the copper ion concentration in a plating environment is around 35 g/L. On one hand, when the concentration is lower, the formation of failures such as cracks increases. On the other hand, when the copper concentration is too high, not all copper will be soluble anymore and crystallization of the copper will take place. A copper concentration in such a high range between 50 g/L and 80 g/L, in particular around 65 g/L, would not have been considered as appropriate in a plating environment, because the probability of copper crystallization is increased. However, and most surprisingly, in this specific concentration range, the electro-plating is improved towards providing a method for filling holes in a PCB with copper, while failures such as cracks and voids are avoided.

FIGS. 1A, 1B, 1C, and 1D illustrate the method of filling a hole 120 in a component carrier 100 with copper 110 according to an exemplary embodiment.

According to FIG. 1A, the component carrier 100 comprises a blind hole 120. The hole 120 is delimited by walls 130 in the horizontal direction, which walls 130 comprise respective surfaces 131. The hole 120 has been drilled with a laser and waste products, in particular black oxides, have been removed.

Figure 1B:
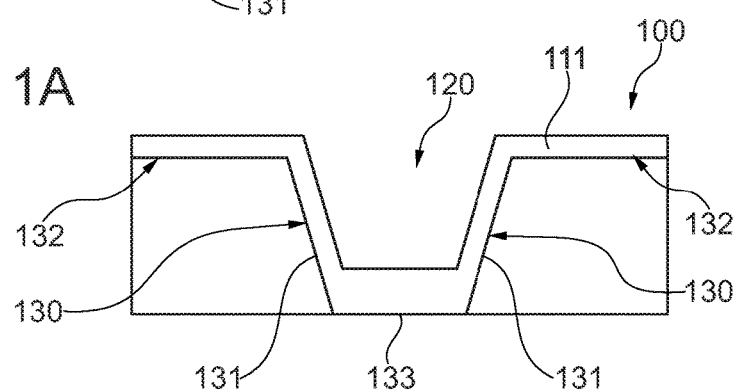

According to FIG. 1B, the method comprises forming a layer of an electrically conductive material 111 covering at least part of the surface 131 of the wall 130, wherein the wall 130 delimits the hole 120. This layer forming is done by an electro-less plating process. The formed layer of electrically conductive material 111 comprises a thickness in the range between 0.1 μm and 1 μm, in particular in the range between 0.3 μm and 0.7 μm. The hole 120 is a blind hole and therefore also comprises a bottom structure 133, which delimits the hole 120 in a vertical direction. The aspect ratio of the hole 120 is approximately 0.9. It should be noted that the layer of electrically conductive material 111 above the bottom structure 133 is thicker than the layer of electrically conductive material 111 above the walls 130.

Furthermore, the surface of the electrically conductive material 111 is smooth. In summary, the thickness of the layer of electrically conductive material 111 at the walls 130, and at the bottom 133 is comparatively thick and regularly shaped. As a consequence, the filling of the hole 120 with electrically conductive material is not hampered and will be performable in an efficient manner.

According to FIG. 1C, the method further comprises subsequently covering at least partially the layer 111 and filling at least partially an unfilled volume 121 of the hole 120 with copper 110 using an electro-plating process including a bath. The growing directions of the copper material 110 are illustrated with bold arrows. It can be seen that the growing takes place in a regular manner and no unfilled gaps remain within the copper material 110. Hereby, it is mandatory that the bath comprises a concentration of a copper ion, in particular $Cu^{2+}$, in a range between 50 g/L and 75 g/L, in particular in a range between 60 g/L and 70 g/L.

According to the specific embodiment described here the thickness of the layer of electrically conductive material 111 and the copper layer 110 at the bottom 133 is 10.84 µm, while the thickness at the left wall 130 is 7.31 µm and the thickness at the right wall 130 is 7.48 µm. Hereby, the hole 120 is 67.36 µm in height and the largest diameter of the hole 120 is 83.26 µm. Above shoulders 132 to the left and right side of the top of the hole 120, the thickness is 2.93 µm.

Figure 1C:
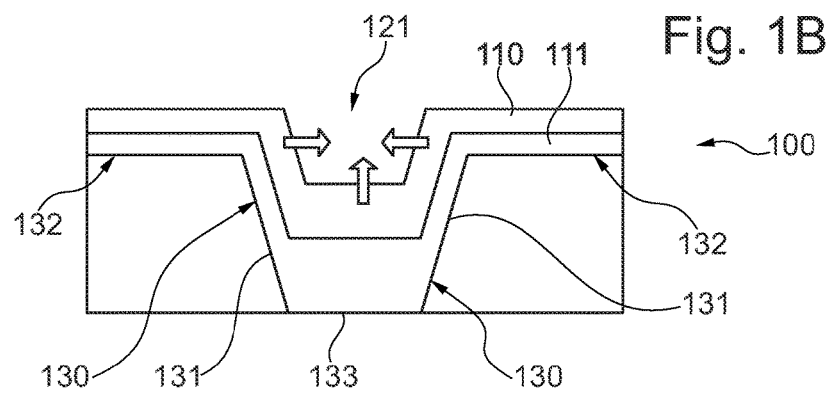
Figure 1D:
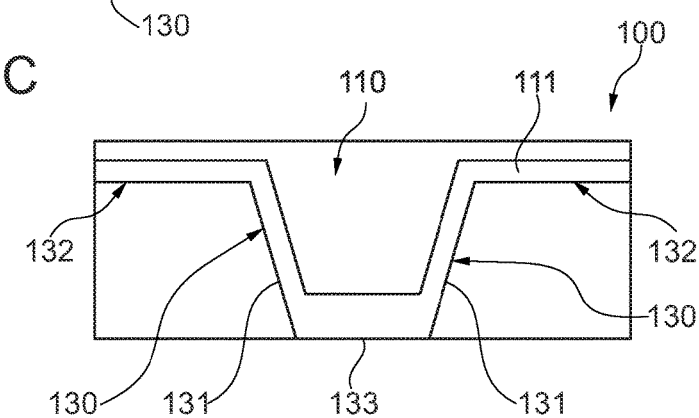

According to FIG. 1D, the hole has been completely filled with copper 110 and the filled copper material 110 does not comprise any failures such as cracks and/or voids.

Figure 2:
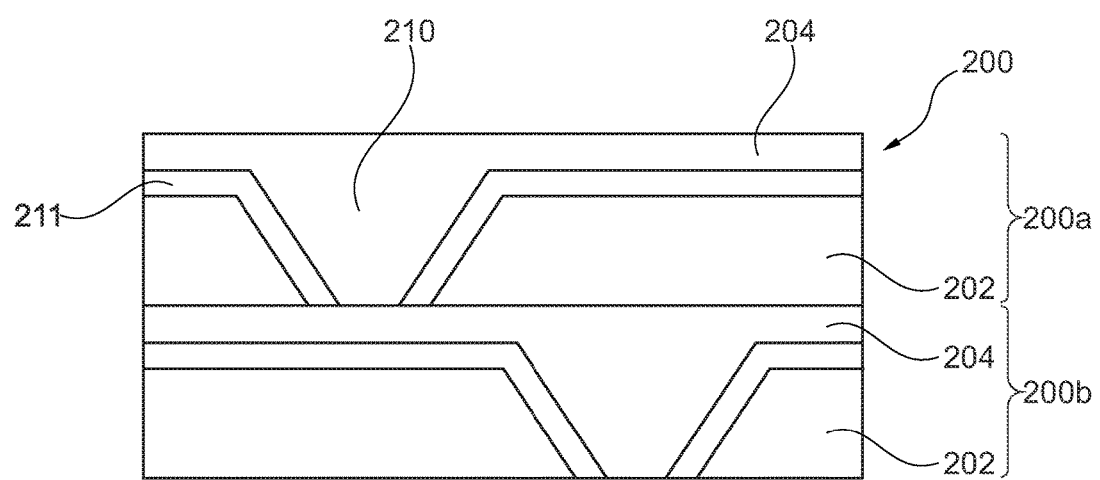
FIG. 2 illustrates an exemplary embodiment of a component carrier, which has been manufactured with the method.
Figure 3A:
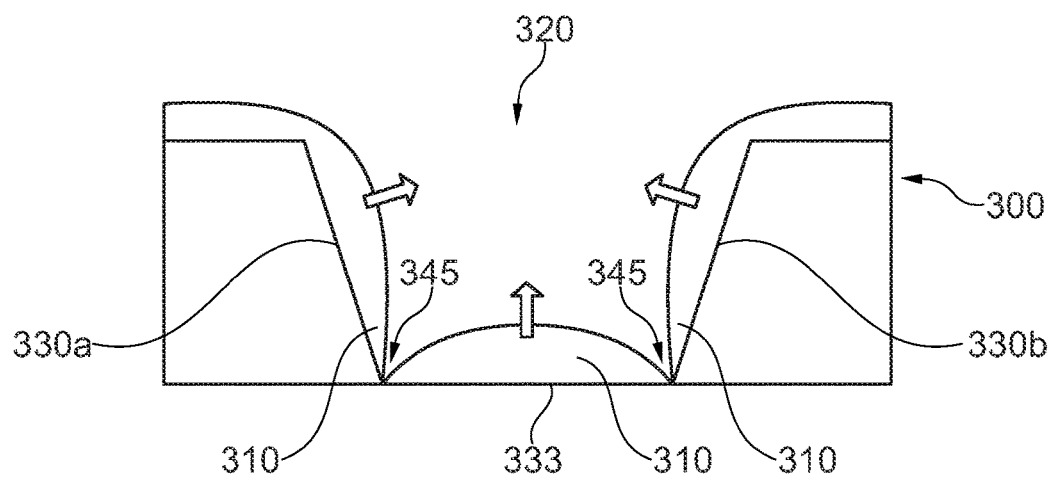
FIG. 3A and FIG. 3B illustrate a prior art example of filling a hole in a component carrier.
Figure 3B:
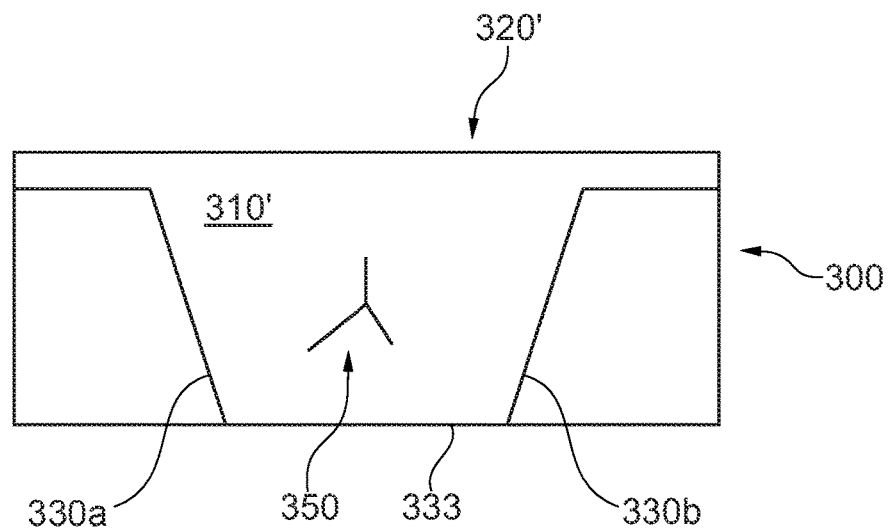
Figure 4A:
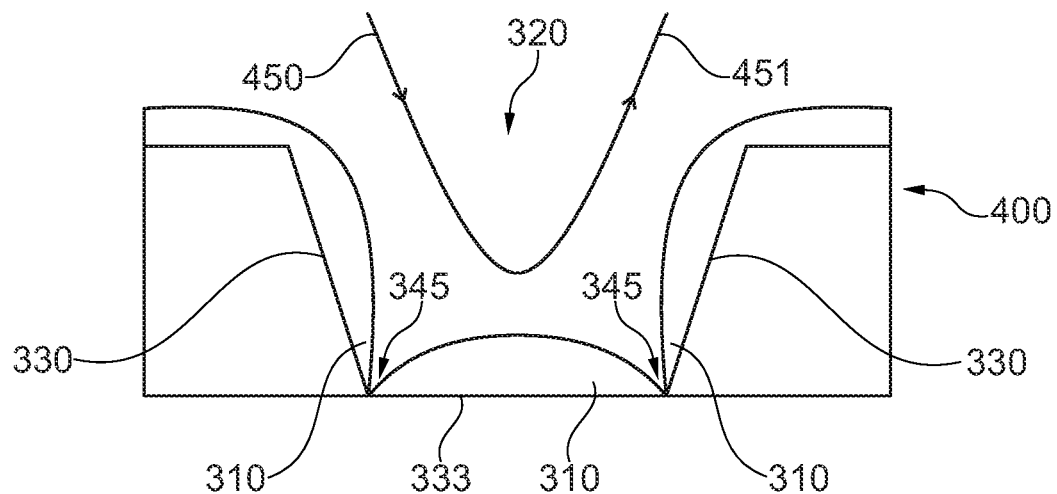
FIG. 4A and FIG. 4B illustrate a prior art example of filling a hole in a component carrier by using chemical additives.
Figure 4B:
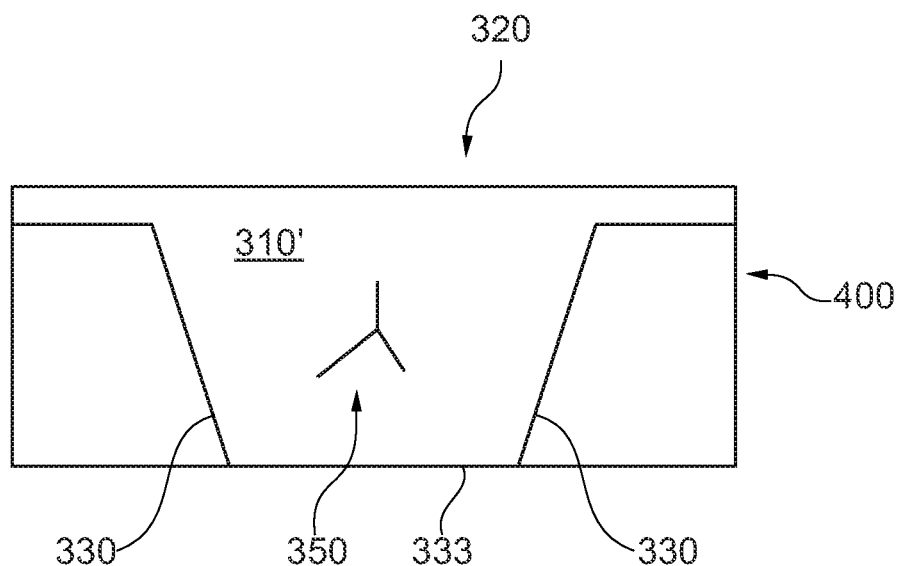

FIG. 2 illustrates an exemplary embodiment of a component carrier 200. The component carrier 200 consists of a stack of a plurality of electrically insulating layer structures 202 and a plurality of electrically conductive layer structures 204. The component carrier 200 has been manufactured by the method described above and comprises a high quality electrically conductive material 210 without failures such as cracks and/or voids. The material 210 is copper, which has been filled into a hole of the component carrier 200 by means of an electro-plating process on top of an electrically conductive layer 211. In this manner, a first layer 200a and a second layer 200b of the component carrier 200 can be electrically interconnected.

Figure 6A:
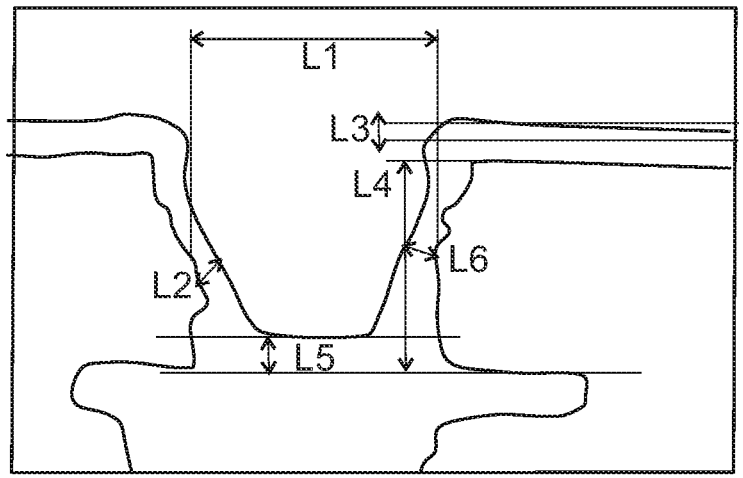
FIG. 6A and FIG. 6B illustrate experimental data of a conventional hole according to the prior art and a hole according to an exemplary embodiment of the invention.
Figure 6B:
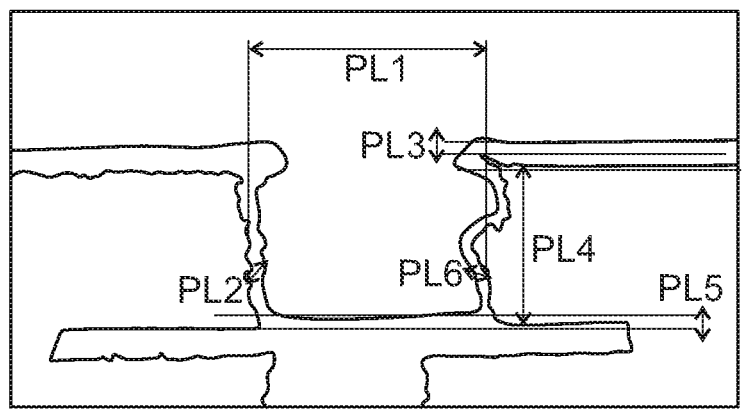

FIGS. 6A and 6B illustrate experimental data in the form of photograph of a hole in a component carrier according to an exemplary embodiment of the invention (FIG. 6A) and a photograph of a conventional hole in a component carrier according to the prior art (FIG. 6B).

FIG. 6A corresponds, from a technical point of view, to the exemplary embodiment of FIG. 1C. A hole in a component carrier has been plated with electrically conductive material, wherein the hole is arranged above a further electrically conductive layer structure below the hole. The dimensions in these experimental data are as follows: 83.26 µm (L1), 7.48 µm (L2), 2.93 µm (L3), 67.36 µm (L4), 10.84 µm (L5), and 7.31 µm (L6).

Figure 5:
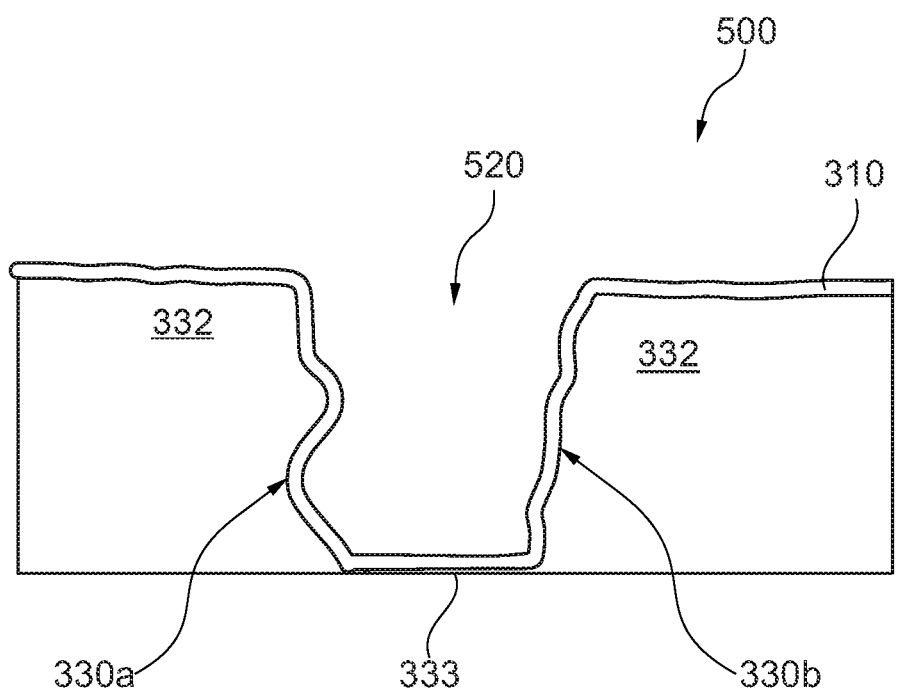
FIG. 5 illustrates a prior art example of a conventional hole in a conventional component carrier.

FIG. 6B corresponds from a technical point of view, to FIG. 5. According to the prior art, a conventional hole in a conventional component carrier has been plated with electrically conductive material. Hereby the conventional hole is arranged above a further electrically conductive layer structure below the conventional hole. The layer thicknesses in these experimental data are as follows: 83.36 µm (PL1), 4.84 µm (PL2), 4.18 µm (PL3), 63.68 µm (PL4), 4.18 µm (PL5), and 4.27 µm (PL6).

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS 100 component carrier
110 copper material
111 layer of electrically conductive material
120 hole
121 unfilled volume
130 wall
131 surface
132 shoulder
133 bottom structure
200 failure-free component carrier
200a first layer
200b second layer
202 electrically insulating layer structure
204 electrically conductive layer structure
210 copper material
211 layer of electrically conductive material
300 conventional component carrier
310 copper material
320 unfilled volume
330 wall
332 shoulder
333 bottom structure
345 gap
350 crack and void
400 conventional component carrier
450 chemical additives source
451 chemical additives drain
500 conventional component carrier
520 conventional hole

We claim:

1. A method of filling a hole formed in a component carrier with copper, the method comprising:
    forming a layer of an electrically conductive material covering at least part of a surface of a wall, wherein the wall delimits the hole; and
    subsequently, covering at least partially the layer and filling at least partially an unfilled volume of the hole with copper using a plating process including a bath, wherein the bath comprises a concentration of a copper ion in a range between 50 g/L and 75 g/L, and
    wherein at least partially covering the layer and at least partially filling the hole are done by flash-plating.

2. The method according to claim 1, further comprising: supplying the bath with copper sulfate ($CuSO_4$) and/or copper sulfate pentahydrate ($CuSO_4*5H_2O$).

3. The method according to claim 1, wherein the bath further comprises:
    sulfuric acid ($H_2SO_4$) with a concentration in a range between 80 g/L and 110 g/L.

4. The method according to claim 1, wherein the bath further comprises:
    at least one of the group consisting of iron ions, chloride ($Cl^-$) a brightening agent, and a leveler agent.

5. The method according to claim 1, further comprising:
    filling at least partially a remaining volume of the hole with copper using a further plating process including a further bath, wherein the further bath comprises at least approximately the same composition of chemical ingredients and/or at least approximately the same concentration of chemical ingredients as the first bath.

6. The method according to claim 1, further comprising:
    filling at least partially a remaining volume of the hole with copper using a further plating process including a further bath, wherein the further bath comprises a different composition of chemical ingredients and/or a different concentration of chemical ingredients as the first bath.

7. The method according to claim 1, wherein a formed layer of electrically conductive material comprises a thickness in a range between 0.1 μm and 1 μm, and/or
   wherein a copper material, which has been formed above the formed layer of electrically conductive material, comprises a thickness in a range between 0.3 μm and 15 μm.

8. The method according to claim 1, wherein forming the layer of electrically conductive material is done by electroless plating.

9. The method according to claim 1, further comprising:
   drilling the hole with a laser; and
   removing waste products caused by laser drilling.

10. The method according to claim 1, further comprising:
    drilling the hole with a laser; and
    wherein the forming of the layer is performed without previously removing waste products caused by laser drilling.

11. The method according to claim 1, wherein an aspect ratio of the hole is in a range between 0.5 and 1.5.

12. The method according to claim 1, wherein the hole is configured as a through hole or as a blind hole.

13. The method according to claim 1, wherein the electrically conductive material comprises at least one of the group consisting of copper, aluminum, and nickel.

14. The method according to claim 1, wherein the copper ion is $Cu^{2+}$.

15. The method according to claim 1, wherein the bath comprises a concentration of the copper ion in a range between 60 g/L and 70 g/L.

* * * * *

UNITED STATES PATENT AND TRADEMARK OFFICE
CERTIFICATE OF CORRECTION

PATENT NO.          : 10,455,704 B2
APPLICATION NO.     : 16/049512
DATED               : October 22, 2019
INVENTOR(S)         : Ares Wang, Yee-Bing Ling and Annie Tay Page 1 of 1

It is certified that error appears in the above-identified patent and that said Letters Patent is hereby corrected as shown below:

In the Specification

Column 5, Line 45 includes -- $H_3O^{\pm}$ --; should be -- $H_3O^+$ --.

Signed and Sealed this
Seventeenth Day of March, 2020

Andrei Iancu
*Director of the United States Patent and Trademark Office*